(12) United States Patent
Ko

(10) Patent No.: US 6,340,619 B1
(45) Date of Patent: Jan. 22, 2002

(54) CAPACITOR AND METHOD OF FABRICATING THE SAME

(75) Inventor: Sang-Gi Ko, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 08/871,780

(22) Filed: Jun. 9, 1997

(30) Foreign Application Priority Data

Dec. 26, 1996 (KR) .............................................. 96-72197

(51) Int. Cl.⁷ .......................................... H01L 21/8242
(52) U.S. Cl. ........................ 438/396; 438/239; 438/253; 438/254; 438/397; 438/739
(58) Field of Search ................................. 257/306, 308, 257/307; 438/254, 396, 397, 253, 239, 739

(56) References Cited

U.S. PATENT DOCUMENTS

| | | | | |
|---|---|---|---|---|
| 5,164,337 A | * | 11/1992 | Ogawa et al. ............... | 438/254 |
| 5,170,233 A | * | 12/1992 | Liu et al. ..................... | 257/308 |
| 5,432,116 A | * | 7/1995 | Keum et al. ................. | 438/397 |
| 5,436,186 A | * | 7/1995 | Hsue et al. .................. | 438/397 |
| 5,460,999 A | * | 10/1995 | Hong et al. .................. | 438/397 |
| 5,482,886 A | * | 1/1996 | Park et al. ................... | 438/397 |
| 5,510,289 A | * | 4/1996 | Choi ........................... | 438/397 |
| 5,543,346 A | * | 8/1996 | Keum et al. ................. | 438/397 |
| 5,595,931 A | * | 1/1997 | Kim ............................ | 438/397 |
| 5,656,536 A | * | 8/1997 | Wu .............................. | 438/397 |
| 5,702,974 A | * | 12/1997 | Kim ............................ | 438/397 |
| 5,766,994 A | * | 6/1998 | Tseng ......................... | 438/254 |
| 5,770,499 A | * | 6/1998 | Kwok et al. ................. | 438/253 |
| 5,824,581 A | * | 10/1998 | Tseng ......................... | 438/253 |
| 5,843,822 A | * | 12/1998 | Hsia et al. ................... | 438/254 |
| 5,903,024 A | * | 5/1999 | Hsu ............................. | 257/303 |
| 5,909,621 A | * | 6/1999 | Hsia et al. ................... | 438/254 |
| 5,998,250 A | * | 12/1999 | Andricacos et al. ........ | 438/240 |
| 6,022,772 A | * | 2/2000 | Watanabe .................. | 438/238 |

FOREIGN PATENT DOCUMENTS

JP  62-48062  8/1985

OTHER PUBLICATIONS

Wolf et al., "Chemical Vapor Deposition of Amorphous and Polycrystalline Films", Silicon Processing For the VLSI Era vol. 1 –Process Technology, pp. 183–185, 1986.*

* cited by examiner

Primary Examiner—Carl Whitehead, Jr.
Assistant Examiner—Toniae M. Thomas
(74) Attorney, Agent, or Firm—Morgan, Lewis & Bockius LLP

(57) ABSTRACT

A capacitor includes a substrate, an insulating layer on the substrate, the insulating layer having a contact hole, a first storage node in the contact hole and on the insulating layer, a second storage node on a peripheral portion of the first storage node, the second storage node having a planar top surface, a dielectric layer on the surface of the first and second storage nodes, and a plate node on the dielectric layer.

22 Claims, 12 Drawing Sheets

CAPACITOR AND METHOD OF FABRICATING THE SAME

This application claims the benefit of Korean Application No. 72197/1996 filed Dec. 26, 1996, which is hereby incorporated by reference.

BACKGROUND OF THE INVENTION

1. Field of the Invention

The present invention relates to a semiconductor device, and more particularly, to a semiconductor device having a capacitor and a method of fabricating the same. Although the present invention is suitable for a wide scope of applications, it is particularly suitable for suppressing a leakage current.

2. Discussion of the Related Art

To achieve high integration of semiconductor devices, various cell structures have been proposed to minimize a size of DRAM devices. Generally, in a semiconductor memory cell including a transistor and a capacitor, a signal charge is stored in a storage node of a capacitor connected to a transistor (a switching transistor). Accordingly, a size of a capacitor has a direct relationship with a size of the memory cell. As a result, the amount of charges which can be stored in the storage node is subject to be decreased with the reduced size of capacitor in highly integrated devices.

Therefore, a capacitor storage node of a memory cell requires a minimum surface area to transmit signals generated in the switching transistor without any malfunction. In other words, the storage node of the capacitor must have a relatively large surface area in a limited area of a semiconductor substrate to store large enough charges from the transistor.

Capacitors having a fin structure or a pillar structure are of interest particularly in parallel plate structured capacitors. A capacitor of a pin or pillar structure is useful to increase the its capacitance. However, the capacitor having a pillar structure has a problem of leakage current because high electric field is concentrated at a sharp edged top surface of the capacitor.

A conventional capacitor and a manufacturing method thereof will be explained in details with reference to the accompanying drawings.

FIG. 1 is a cross-sectional view illustrating a structure of a conventional capacitor and FIGS. 2A to 2E are cross-sectional views illustrating the process steps of fabricating the conventional capacitor.

As shown in FIG. 1, an interlayer insulating layer 2 and a blocking layer 3 are formed to have the same contact hole on a predetermined portion of a substrate 1. A storage node 5a is then formed in the contact hole and on a predetermined portion of the blocking layer 3 adjacent to the contact hole. A pillar storage node 8 is formed on a peripheral portion of the surface of the storage node 5a. In this case, the pillar storage node 8 has a sharp edged top surface.

After, a plate node 10 is formed on the entire surface of a dielectric layer 9, a U-form capacitor is completed.

In a conventional method of fabricating a capacitor, an interlayer insulating layer 2 is formed on the substrate 1 using a thermal oxidation process or a chemical vapor deposition (CVD) process, as shown in FIG. 2A. Then, a blocking layer 3, for example, a nitride, is formed on the interlayer insulating layer 2. Next, a photoresist layer 4 is coated on the blocking layer 3. Subsequently, with the photoresist pattern 4 serving as a mask, an anisotropic etching process is applied to the blocking layer 3 and the interlayer insulating layer 2 to expose a predetermined portion of the substrate to form a contact hole.

Referring to FIG. 2B, the remaining photoresist layer 4 is removed and a polysilicon layer 5 is formed on the entire surface. A planar protection layer 6 is then formed on the polysilicon layer 5. For example, phosphosilicate glass (PSG) or borophosphosilicate glass (BPSG) is used for the planar protection layer 6.

Referring to FIG. 2C, another photoresist layer 7 is coated on the entire surface and then is subjected to be patterned by an exposure and development process. With the photoresist pattern 7 serving as a mask, the planar protection layer 6 is anisotropically etched to form a pillar layer 6a over the contract hole.

Referring to FIG. 2D, the remaining photoresist layer 7 is removed. Subsequently, a polysilicon layer is formed on the entire surface and then is anisotropically etched using a reactive ion etching (RIE) method to form a pillar storage node 8 surrounding the pillar layer 6a. In this process, the storage node 5a is anisotropically etched simultaneously. Next, the pillar layer 6a is removed by wet-etching. In this case, the blocking layer 3 serves to protect the interlayer insulating layer 2.

Referring to FIG. 2E, an oxide layer and a polysilicon layer are formed successively on the entire surface and then patterned to form a dielectric layer 9 and a plate node 10. Accordingly, a conventional U-form capacitor is completed.

However, the conventional capacitor and the method of fabricating the same have following problems.

First, since an electric field is concentrated on a sharp edged top surface of a pillar storage node, a leakage current is generated around the sharp edged top surface.

Second, since the height of a pillar storage node is not readily controllable, it is difficult to fabricate the capacitor having a desirable capacitance. As a result, the reproducibility of a capacitor is seriously reduced.

SUMMARY OF THE INVENTION

Accordingly, the present invention is directed to a capacitor and a method of fabricating the same that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a capacitor includes a substrate, a first insulating layer having a contact hole on the substrate, a first storage node formed in the contract hole and on the first insulting layer adjacent to the contact hole; a second storage node formed on a peripheral portion of the first storage node and having a planar top surface, a dielectric layer on surfaces of the first and second storage nodes, and a plate node formed on the dielectric node.

In another aspect of the present invention, a method of fabricating a capacitor includes the steps of providing a substrate, forming a first insulating layer having a contact hole on the substrate, forming a first conductive layer in the contact hole and on the first insulating layer, forming successively a second insulating layer and a third insulating layer which is wider than the second insulating layer on a predetermined portion of the first conductive layer, forming a second conductive layer surrounding the second insulating layer, contacting with the first conductive layer, and having its planar edged top surface, removing the second and third insulating layers, forming a dielectric layer on surfaces of the first and second conductive layers, and forming a third conductive layer on the dielectric layer.

In another aspect of the present invention, a capacitor includes a substrate, an insulating layer on the substrate, the insulting layer having a contact hole over the substrate, a first storage node in the contact hole and on the insulting layer, a second storage node on a peripheral portion of the first storage node, the second storage node having a planar top surface, a dielectric layer on surfaces of the first and second storage nodes, and a plate node on the dielectric layer.

In another aspect of the present invention, a method of fabricating a capacitor having a substrate, the method includes the steps of forming a first insulating layer on the substrate, the first insulating layer having a contact hole over the substrate, forming a first conductive layer in the contact hole and on the first insulating layer, forming a second insulating layer on a predetermined portion of the first conductive layer, forming a third insulating layer on the second insulating layer, the third insulating layer having a width wider than the second insulating layer, forming a second conductive layer surrounding the second insulating layer, the second conductive layer contacting the first conductive layer and having a planar top surface, removing the second and third insulating layers, forming a dielectric layer on surfaces of the first and second conductive layers, and forming a third conductive layer on the dielectric layer.

In another aspect of the present invention, a method of fabricating a capacitor having a substrate, the method includes the steps of forming a first insulating layer on the substrate, the first insulating layer having a contact hole over the substrate, forming a first conductive layer in the contact hole and on the first insulating layer forming a second insulating layer on a predetermined portion of the first conductive layer, forming a third insulating layer on the second insulating layer, the third insulating layer having a width narrower than the second insulating layer, forming a fourth insulating layer on the third insulating layer, the fourth insulating layer having a width wider than the third insulating layer, forming a second conductive layer surrounding the second and fourth insulating layers, the second conductive layer having a planar top surface, forming a dielectric layer on surfaces of the first and second conductive layers, and forming a third conductive layer on the dielectric layer.

In a further aspect of the present invention, a method of fabricating a capacitor having a substrate, the method includes the steps of forming a first insulating layer on the substrate, the first insulating layer having a contact hole, forming a first conductive layer in the contact hole and on the first insulating layer, forming a second insulating layer on the first conductive layer, forming a third insulating layer on the second insulating layer, the third insulating layer having a width wider than the second insulating layer, forming a second conductive layer surrounding the second insulating layer, the second conductive layer contacting the first conductive layer and having a planar top surface, removing the third insulating layer, removing the second insulating layer, removing a portion of the first insulating layer to space apart the first conductive layer from a surface of the insulating layer, forming a dielectric layer on an expose surface over the substrate, and forming a third conductive layer on the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
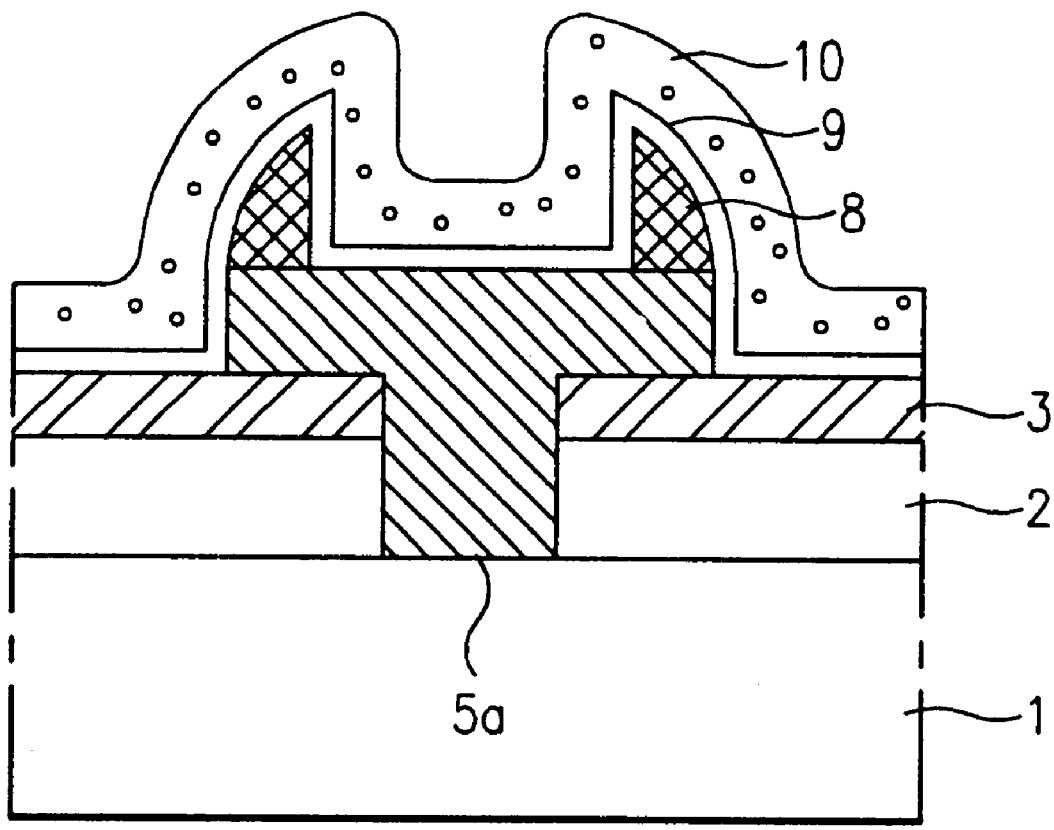
FIG. 1 is a cross-sectional view illustrating a structure of a conventional capacitor.
Figure 2A:
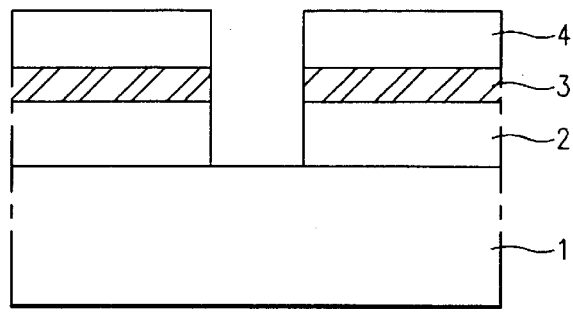
FIGS. 2A to 2E are cross-sectional views illustrating the process steps of fabricating method of the conventional capacitor.
Figure 2B:
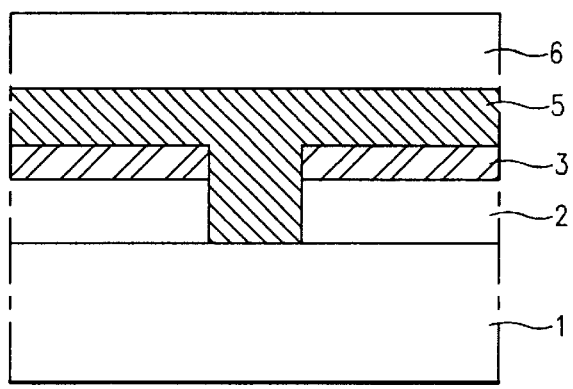
Figure 2C:
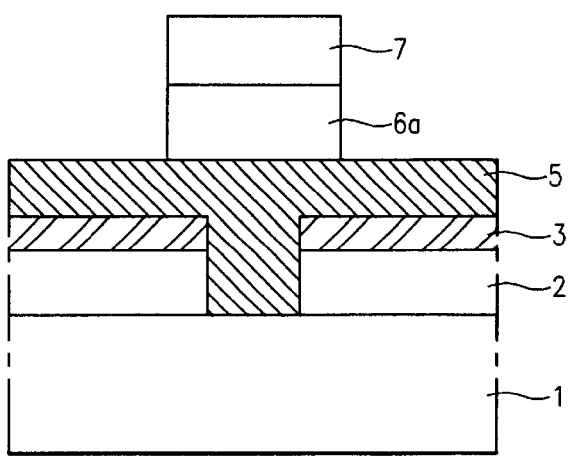
Figure 2D:
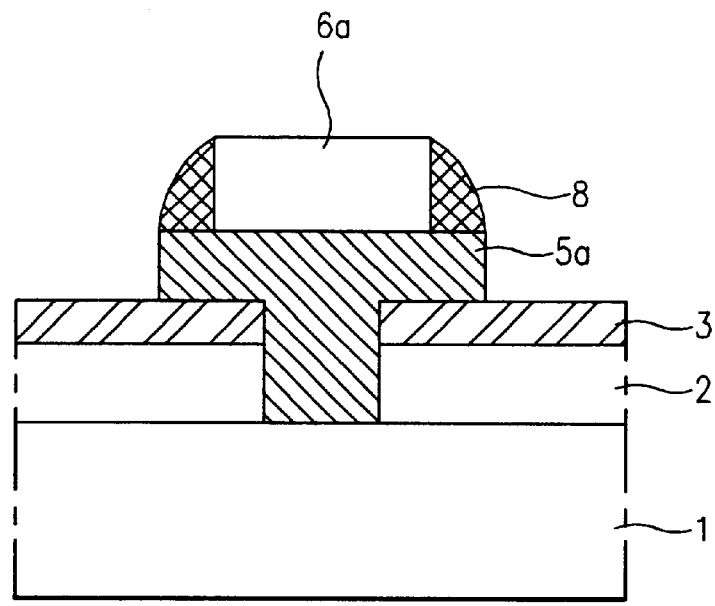
Figure 2E:
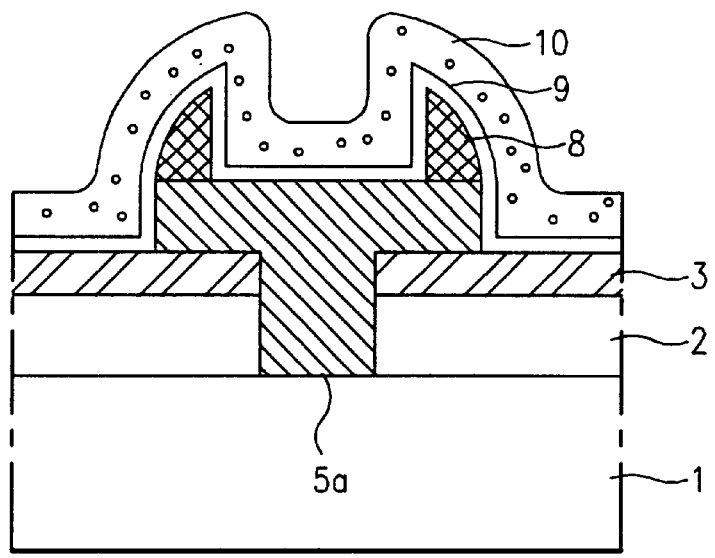
Figure 3:
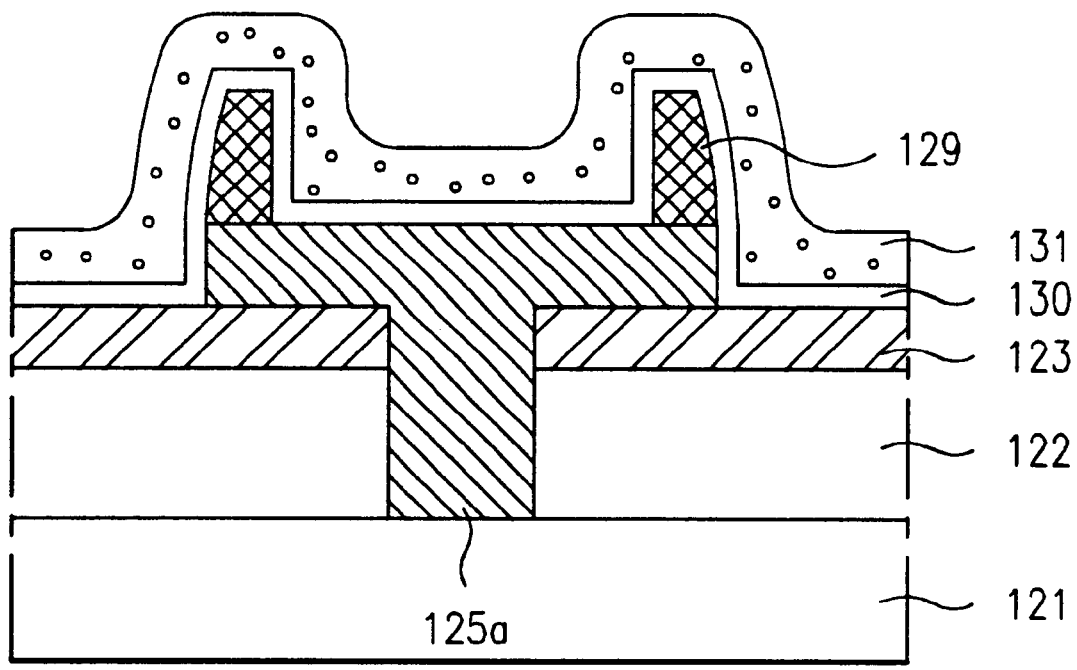
FIG. 3 is a cross-sectional view illustrating a structure of a capacitor according to a first embodiment of the present invention.

Referring to FIG. 3, an interlayer insulating layer 122 and blocking layer 123 having a common contact hole are on a substrate 121. A storage node 125a is in the contact hole and on the blocking layer 123 adjoining to the contact hole. A pillar storage node 129 is on a peripheral portion of the storage node 125a. The top surface of the pillar storage node 129 is planar.

A dielectric layer 130 is the formed on surfaces of the storage node 125a, the pillar storage node 129 and the blocking layer 123. A plate node 131 is formed on the dielectric layer 130 to complete a U-form capacitor.

A fabricating method of a capacitor having the aforementioned structure according to the first embodiment will be explained with reference to the accompanying drawings.

Figure 4A:
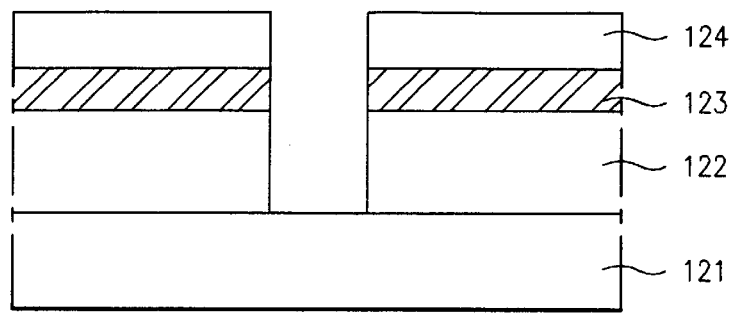
FIGS. 4A to 4F are cross-sectional views illustrating the process steps of fabricating method of a capacitor according to the first embodiment of the present invention.

Referring initially to FIG. 4A, an interlayer insulating layer 122 is formed on a substrate 121 with a thermal oxidation process or a chemical vapor deposition (CVD) process. Subsequently, a blocking layer 123 and a photoresist layer 124 are formed on the interlayer insulting layer 122. Next, the photoresist layer 124 is subjected to be patterned by an exposure and development process to expose a portion for a contact hole. Thereafter, with the photoresist pattern 124 serving as a mask, the blocking layer 123 and the interlayer insulating layer 122 are selectively removed to form the contact hole.

Figure 4B:
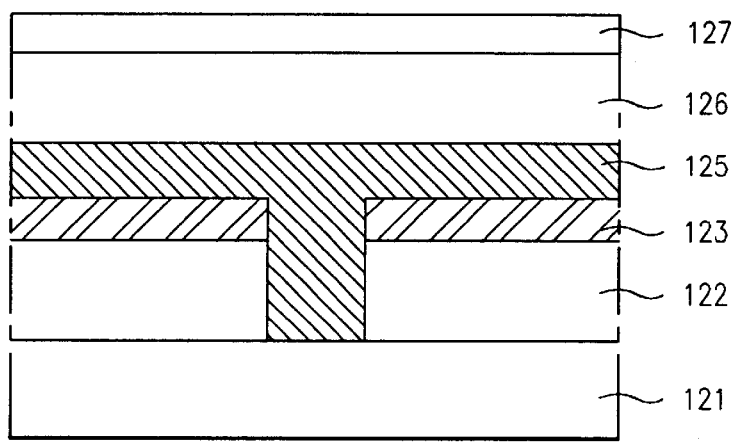

Referring to FIG. 4B, the remaining photoresist layer 124 is removed and then a polysilicon layer 125 is formed on the entire exposed surface. Next, a planar protection layer 126 is formed on the entire surface of the polysilicon layer 125. In this process, the planar protection layer 126 includes phosphosilicate glass PSG) or borophosphosilicate glass (BPSG). Subsequently, an insulating layer 127, such as high temperature low pressure dielectric (HLD) or high temperature oxide (HTO), is formed on the planar protection layer 126.

Figure 4C:
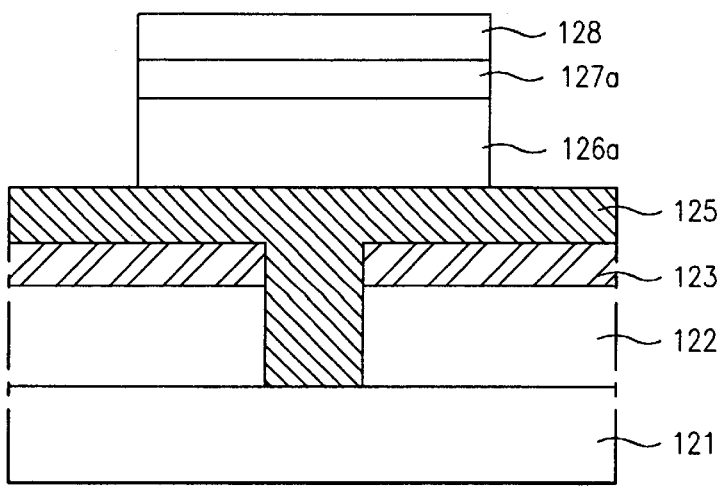

Referring to FIG. 4C, a photoresist layer 128 is coated on the entire surface and then a portion of the photoresist layer 128 exclusive of a portion over a capacitor to be formed is removed. With the photoresist pattern 128 serving as a mask, the first insulating layer 127 and the planar protection layer 126 are anisotropically etched to form first and second pillar layers 126a and 127a.

Figure 4D:
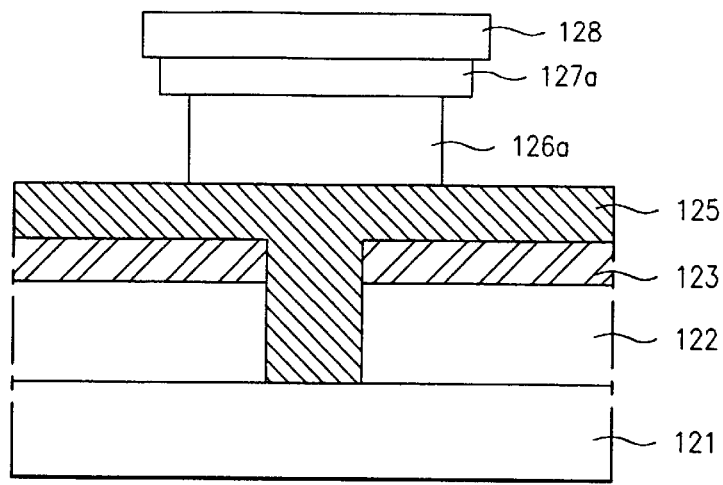

Referring to FIG. 4D, with the photoresist pattern 128 serving as a mask, sides of the first and second pillar layers 126a and 127a are laterally wet-etched so that the second pillar layer 127a has a width narrower than the photoresist pattern 128. The first pillar layer 126a has thus a width narrower than the second pillar layer 127a and the second pillar layer 127a has a width narrower than the photoresist pattern 128. In this process, the etching rate of the second pillar layer 127a is lower than that of the first pillar layer 126a. The etched second pillar layer 127a serves as a cap for the first pillar layer 126a.

Figure 4E:
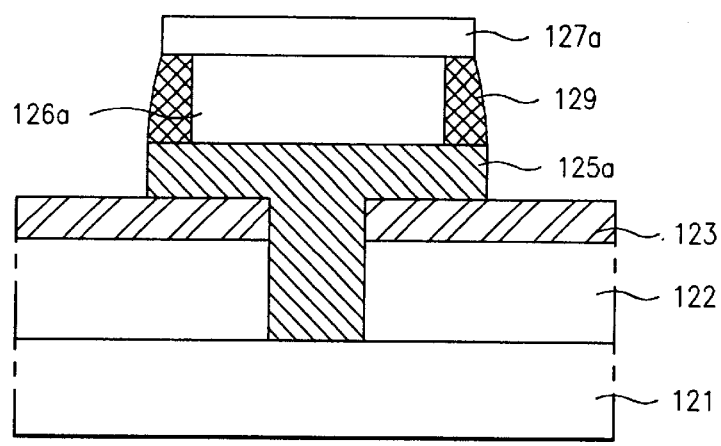

Referring to FIG. 4E, the remaining photoresist layer 128 is removed. A polysilicon layer is then formed on the entire exposed surface and anisotropically over-etched to form a pillar storage node 129 surrounding the first pillar layer 126a. Simultaneously, the polysilicon layer 125 is selectively removed to form a storage node 125a.

Figure 4F:
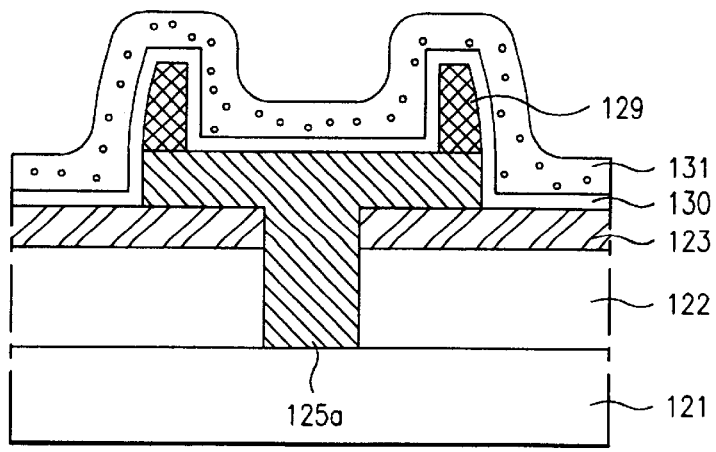

Referring to FIG. 4F, the first and second pillar layer 126a and 127a are removed using wet-etching. In this process, the blocking layer 123 serves to protect the interlayer insulating layer 122.

Thereafter, an oxide layer and a polysilicon layer are successively formed on the entire surface and then are patterned to form a dielectric layer 130 and a plate node 131. Accordingly, a capacitor according to the first embodiment of the invention is completed. In this embodiment, a stack of layers, for example, an oxide/nitride layer or an oxide/nitride/oxide layer, can be used instead of the insulating layer.

Figure 5:
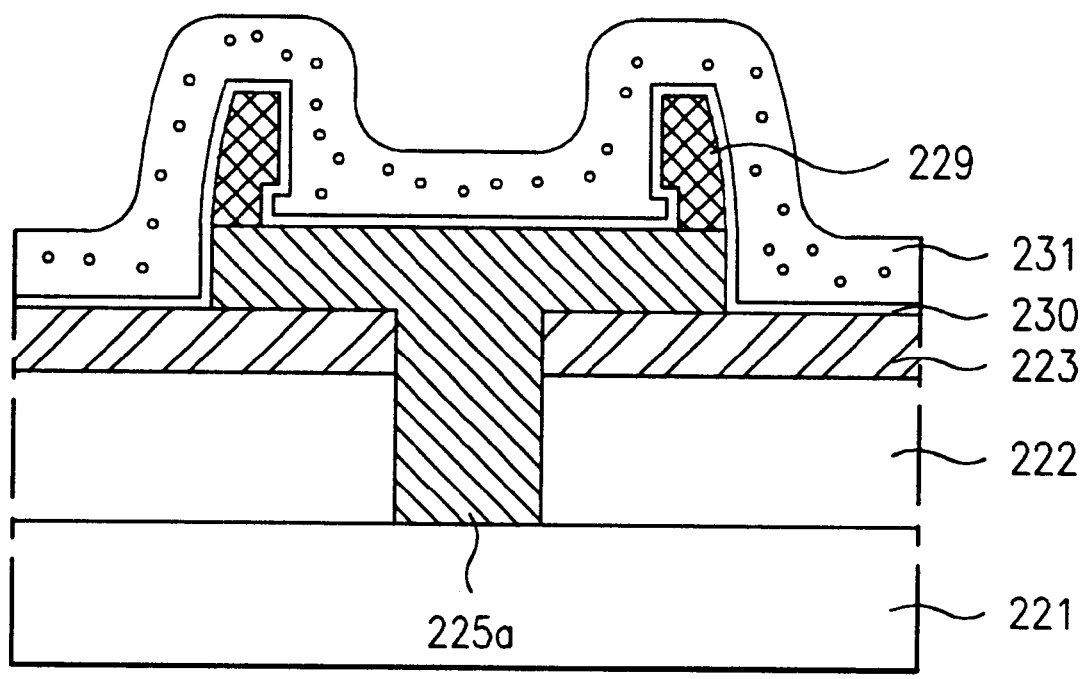
FIG. 5 is a cross-sectional view illustrating a structure of a capacitor according to a second embodiment of the invention.

FIG. 5 illustrates a structure of a capacitor according to a second embodiment of the present invention and FIGS. 6A to 6F are cross-sectional views illustrating the process steps of a method of fabricating a capacitor according to the second embodiment of the invention.

Referring to FIG. 5, an interlayer insulating layer 222 and a blocking layer 223 are on a predetermined portion of a substrate 221 and have a contact hole to expose a portion of the substrate 221. A storage node 225a is in the contact hole and on the blocking layer 223 adjacent to the contact hole. A pillar storage node 229 is on a peripheral portion of the storage node 225a. In this embodiment, the top surface of the pillar storage node 229 is planar and the lower portion of the inner surface of the pillar storage node 229 has a groove.

A dielectric layer 230 is on the surfaces of the storage node 225a, the pillar storage node 229 and the portion of the blocking layer 223. A plate node 231 is formed on the surface of the dielectric layer 230 to complete a U-form capacitor according to the second embodiment of the invention.

A fabricating method of a capacitor having the aforementioned structure will be explained with reference to the accompanying drawings.

Figure 6A:
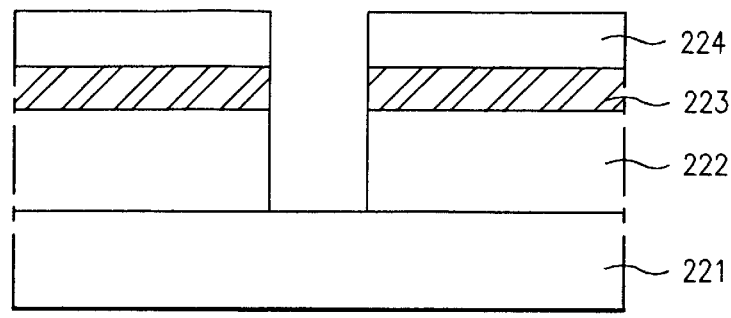
FIGS. 6A to 6F are cross-sectional views illustrating the process steps of fabricating method of a capacitor according to the second embodiment of the present invention.

Referring to FIG. 6A, an interlayer insulating layer 222 is formed by a thermal oxidation process or a chemical vapor deposition (CVD) process. Then, a nitride layer is deposited on the interlayer insulating layer 222 to form a blocking layer 223. Next, a photoresist layer 224 is formed on the blocking layer 223 and then is subjected to be patterned by an exposure and development process to remove a portion of the photoresist layer 224 over a contact hole. With the photoresist pattern 224 serving as a mask, the blocking layer 223 and the interlayer insulating layer 222 are anisotropically etched to form the contact hole.

Figure 6B:
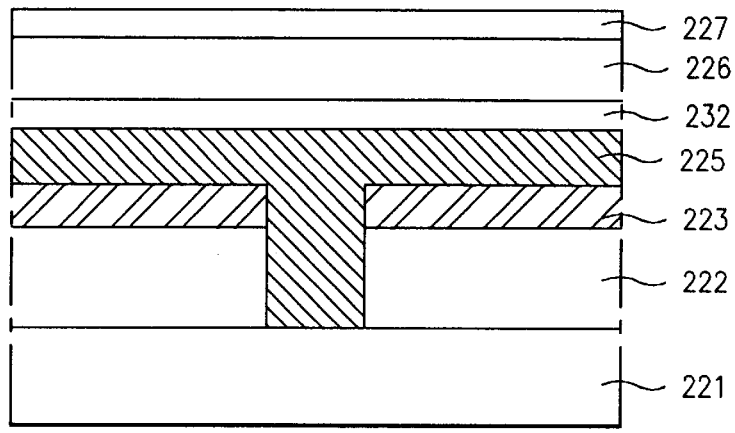

Referring to FIG. 6B, the remaining photoresist layer 224 is removed and then a polysilicon layer 225 is formed on the entire surface. Subsequently, a second insulating layer 232, such as high temperature low pressure dielectric (HLD) or high temperature oxide (HTO), is formed on the polysilicon layer 225. A planar protection layer 226 is then formed on the second insulating layer 232. For example, phosphosilicate glass (PSG) or borophosphosilicate glass (BPSG) may be used as the planar protection layer 226. A fourth insulating layer 227, such as HLD or HTO, is formed on the planar protection layer 226. The second insulating layer 232 and the fourth insulating layer 227 have an etching rate greater than the planar protection layer 226.

Figure 6C:
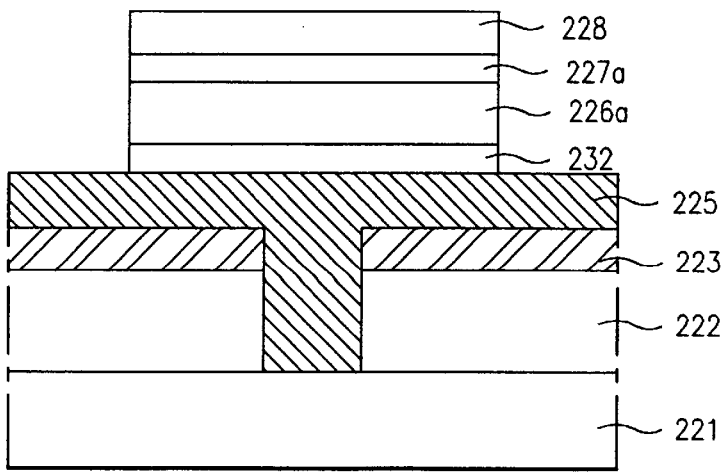

Referring to FIG. 6C, a photoresist layer 228 is coated on the entire surface and then is subjected to be patterned by an exposure and development process to remove a portion of photoresist layer 228 exclusive of a portion over a capacitor. With the photoresist pattern 228 serving as a mask, anisotropic etching is applied to the first insulating layer 227, the planar protection layer 226, and the third insulating layer 232 to form first, second, and third pillar layers 226a, 227a, and 232a, respectively.

Figure 6D:
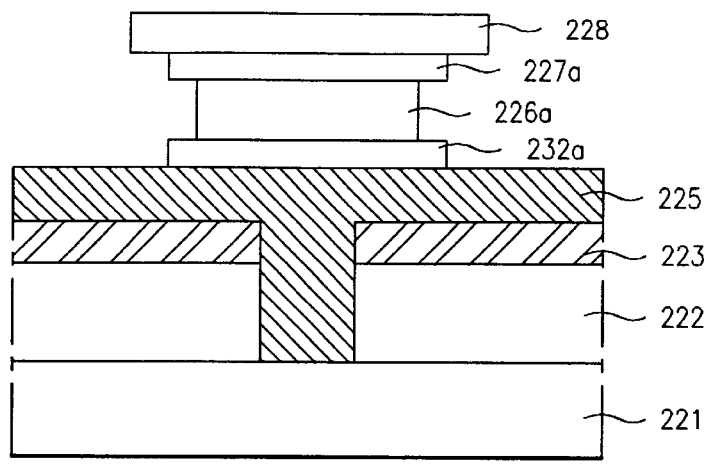

Referring to FIG. 6D, with the photoresist pattern 228 serving as a mask, the first, second, and third pillar layers 226a, 227a, 232a are wet-etched using the etch rate of the first pillar layer 226a higher than those of the second and third pillar layers 227a and 232a. Thus, the first pillar layer 226a has a width narrower than those of the second and third pillar layers 227a and 232a. The etched second pillar layer 227a serves as a cap for the first pillar layer 226a.

Figure 6E:
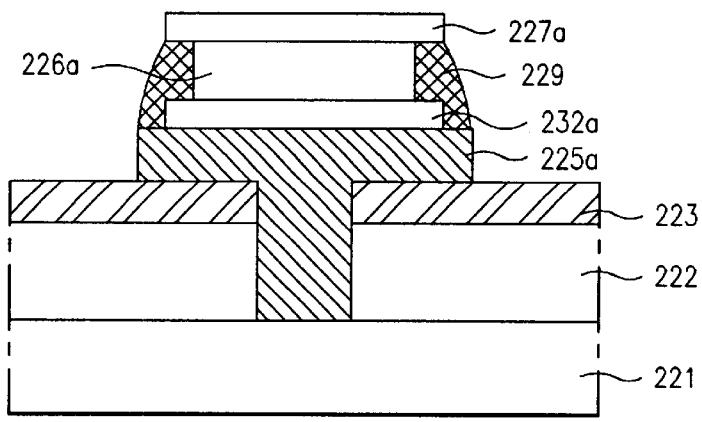

Referring to FIG. 6E, the remaining photoresist layer 228 is removed and then a polysilicon layer is formed on the entire surface. The polysilicon layer is anisotropically etched to form a pillar storage node 229 surrounding the first and third pillar layers 226a and 232a. Simultaneously, the storage node 225a is anisotropically etched.

Figure 6F:
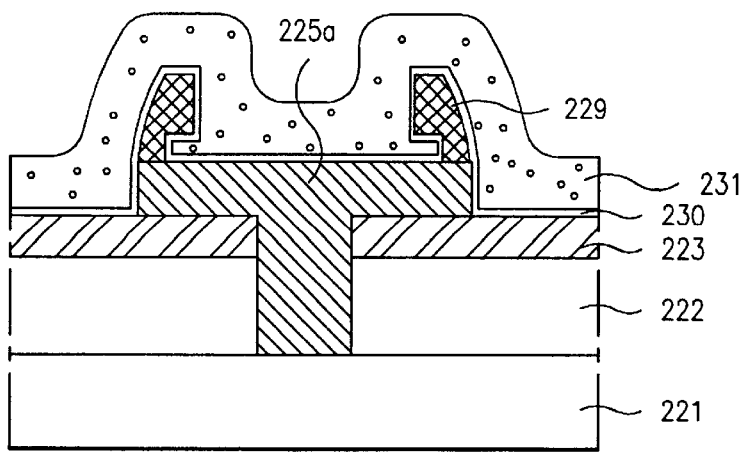

Referring to FIG. 6F, the first, second, and third pillar layers 226a, 227a, and 232a are removed using wet-etching. During the wet-etching process, the blocking layer 223 serves to prevent the interlayer insulating layer 222 from being etched. Thereafter, an oxide layer and a polysilicon layer are formed on the entire exposed surface and then are patterned to form a dielectric layer 230 and a plate node 231 to complete a capacitor according to the second embodiment of the present invention. In this embodiment, a stack of layer, such as an oxide/nitride layer or an oxide/nitride/oxide layer, can be used instead of the oxide layer.

Figure 7:
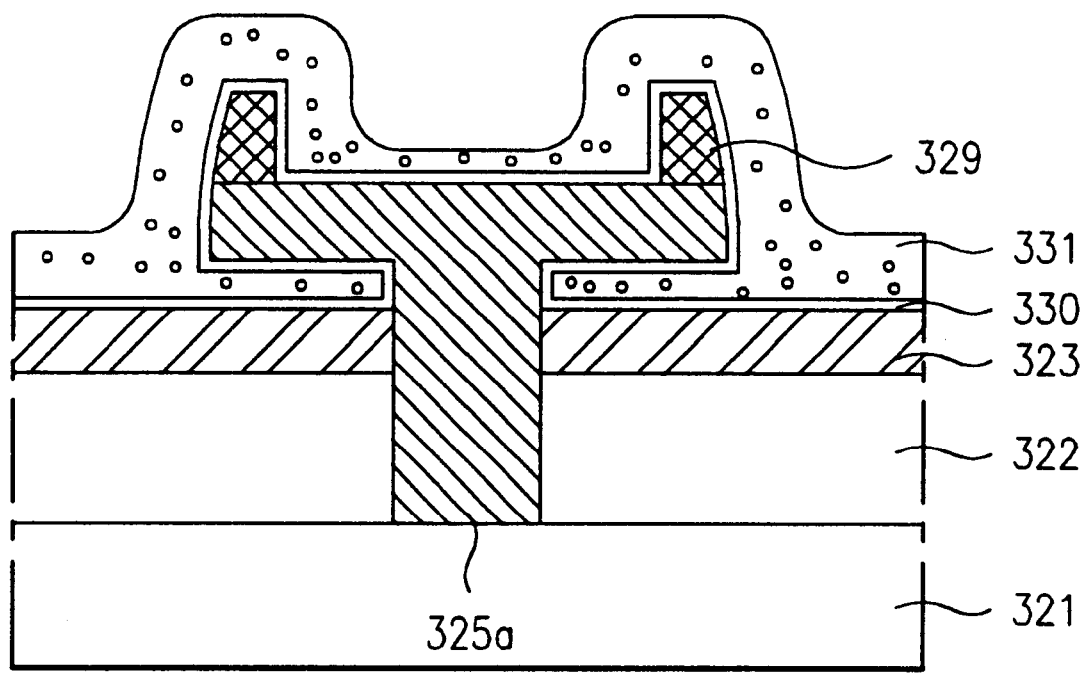
FIG. 7 is a cross-sectional view illustrating a structure of a capacitor according to a third embodiment of the present invention.

FIG. 7 illustrates a structure of a capacitor according to a third embodiment of the present invention. FIGS. 8A to 8F are cross-sectional views illustrating the process steps of a fabricating method of a capacitor according to the third embodiment of the present invention.

Referring to FIG. 7, an interlayer insulating layer 322 and a blocking layer 323 are on a predetermined portion of a substrate 321 and have a contact hole to expose a portion of the substrate 321. A storage node 325a having a T-form cross-section is formed in the contact hole. The storage node 325a is spaced apart from the surface of the blocking layer 323. A pillar storage node 329 is formed on a peripheral portion of the storage node 325a. In this embodiment, the top surface portion of the pillar storage node 329 is planar and does not have a sharp edge.

A dielectric layer 330 is formed surrounding the pillar storage node 329, the storage node 325a and the blocking layer 323. Then, a plate node 331 is formed on the entire exposed surface the dielectric layer 330 to complete a U-form capacitor according to the second embodiment of the present invention.

A fabricating method of a capacitor according to the third embodiment of the invention will be explained with reference to the accompanying drawings.

Figure 8A:
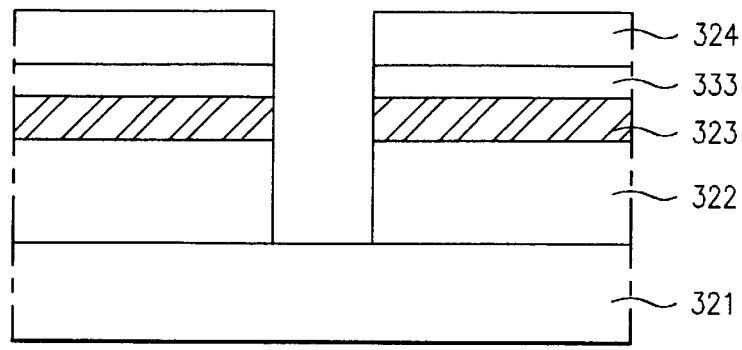
FIGS. 8A to 8E are cross-sectional views illustrating the process steps of fabricating method of a capacitor according to the third embodiment of the present invention.

Referring to FIG. 8A, an interlayer insulting layer 322 is formed on a substrate 321 by a thermal oxidation process and a chemical vapor deposition (CVD) method. Then, a blocking layer 323, such as nitride, is formed on the interlayer insulating layer 322. Next, a third insulating layer 333 is formed on the blocking layer 323 using the CVD method. A photoresist layer 324 is coated on the third insulating layer 333 and then is subjected to be patterned by an exposure and development process to remove a portion of the photoresist layer 324 over a contact hole. With the photoresist pattern 324 serving as a mask, the blocking layer 323, the interlayer insulating layer 322, and the third insulating layer 333 are selectively removed to form the contact hole.

Figure 8B:
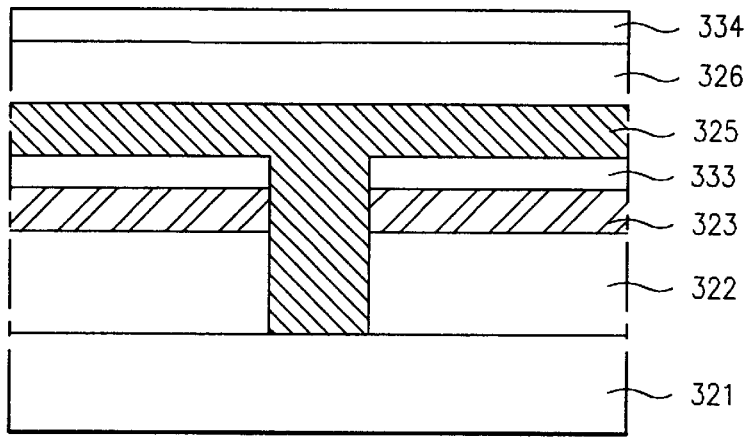

Referring to FIG. 8B, the remaining photoresist layer 324 is removed, and then a polysilicon layer 325 is formed on the entire surface. Next, a planar protection layer 326 such as PSG or BPSG and a fourth insulating layer 334 such as nitride are successively formed on the polysilicon layer 325.

Figure 8C:
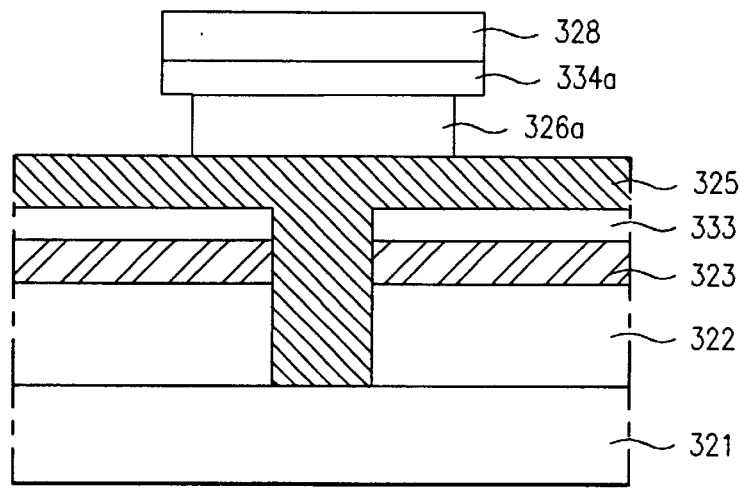

Referring to FIG. 8C, a photoresist layer 328 is coated on the entire surface and then is patterned to have a portion of photoresist layer 328 over the contact hole. With the photoresist pattern 328 serving as a mask, the fourth insulating layer 334 and the planar protection layer 326 are anisotropically etched to form first and second pillar layers 326a and 334a over the contact hole. Thereafter, with the photoresist pattern 328 and the second pillar layer 334a serving as a mask, the first pillar layer 326a is wet-etched to have a width narrower than the second pillar layer 334a. The second pillar layer 334a serves as a cap for the first pillar layer 326a.

Figure 8D:
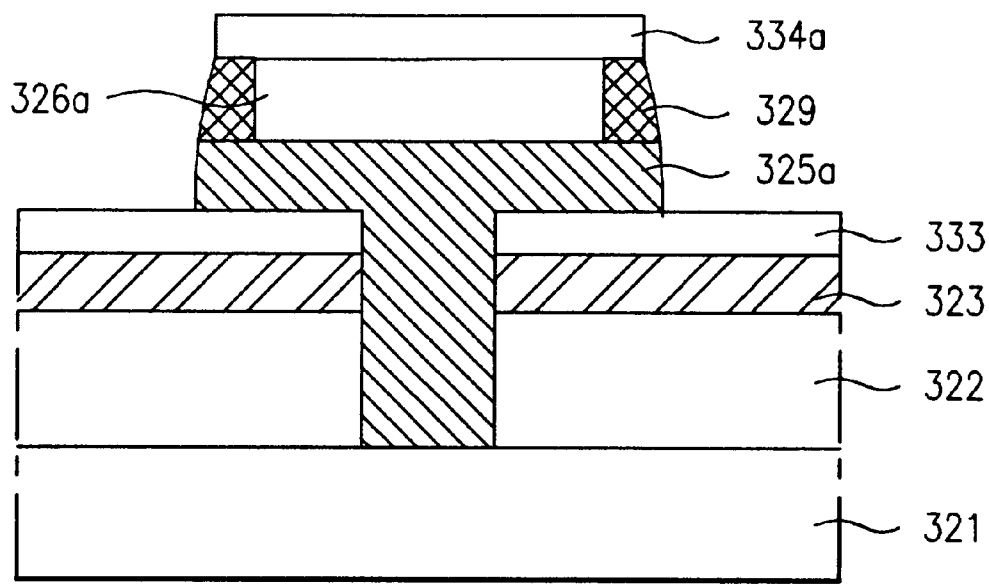

Referring to FIG. 8D, the remaining photoresist layer 328 is removed. A polysilicon layer is formed on the entire exposed surface and then is anisotropically etched to form a pillar storage node 329 surrounding the first pillar layer 326a. In this process, simultaneously, the storage node 325a is anisotropically etched to have a T-form cross-section.

Figure 8E:
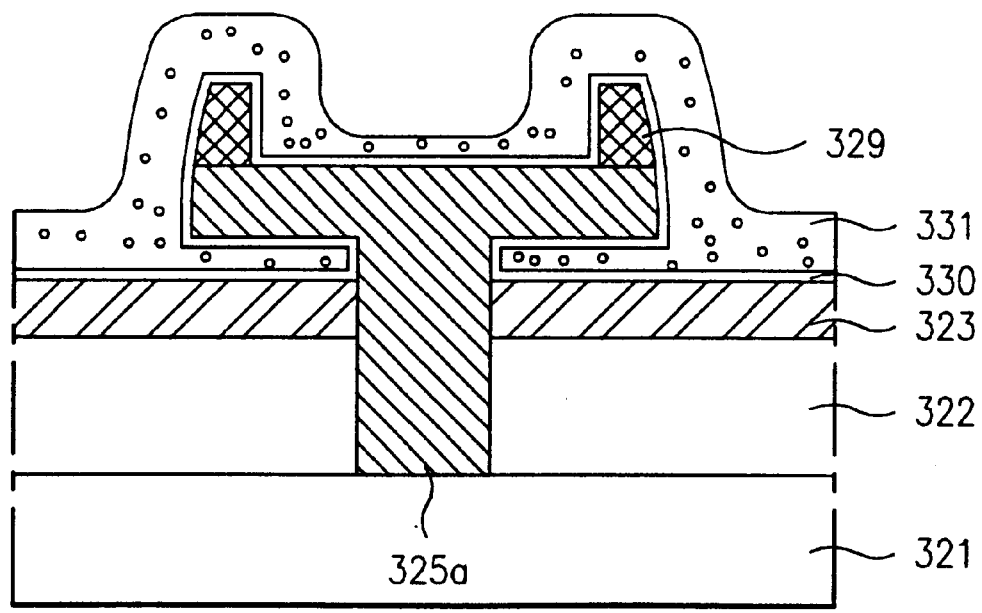

Referring to FIG. 8E, the second pillar layer 334a is removed by either wet-etching or anisotropic etching. The first pillar layer 326a and the third insulating layer 333 are then removed using wet-etching. During the wet-etching, the blocking layer 323 serves to prevent the interlayer insulating layer 322 from being etched. Subsequently, an oxide layer and a polysilicon layer are successively formed on the entire surface and then are patterned to form a dielectric layer 330 and a plate node 331 to complete a capacitor according to the third embodiment of the present invention. In this embodiment, instead of the oxide layer, a stack of layers such as an oxide/nitride layer or an oxide/nitride/oxide layer can be used.

A capacitor and a method of fabricating the same in the present invention have the following advantages.

First, since first and second pillar layers have different wet-etching rates, a pillar storage node does not have a sharp edged top surface, so that the leakage current is suppressed by the planar structure.

Second, when anisotropic etching is used to form the pillar storage node, the height of the pillar storage node is very consistent because the second pillar layer acts as a blocking layer.

It will be apparent to those skilled in the art that various modification and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A method of fabricating a capacitor on a substrate, the method comprising the steps of:

forming a first insulating layer on the substrate, the first insulating layer having a contact hole over the substrate;

forming a first conductive layer in the contact hole and on the first insulating layer;

forming a second insulating layer on a portion of the first conductive layer;

forming a third insulating layer on the second insulating layer, the third insulating layer having a width wider than the second insulating layer;

forming a second conductive layer surrounding the second insulating layer, the second conductive layer contacting the first conductive layer and not having a portion below the first conductive layer, and having only a substantially vertically extended portion, whereby the second conductive layer does not have a sharp edged top surface so that a leakage current around the top surface is suppressed;

removing the second and third insulating layers;

forming a dielectric layer on surfaces of the first and second conductive layers; and forming a third conductive layer on the dielectric layer.

2. The method according to claim 1, wherein the first insulating layer includes multi-layers having different insulating characteristics.

3. The method according to claim 1, wherein the first insulating layer includes one of an oxide/nitride layer or an oxide/nitride/oxide layer.

4. The method according to claim 1, wherein the first conductive layer is a polysilicon layer.

5. The method according to claim 1, wherein the second insulating layer has a etching rate higher than the third insulating layer.

6. The method according to claim 1, wherein the second insulating layer includes one of phosphosilicate glass (PSG) or borophosphosilicate glass (BPSG).

7. The method according to claim 1, wherein the third insulating layer includes one of high temperature low pressure dielectric (HLD) or high temperature oxide (HTO).

8. The method according to claim 1, wherein the second and third insulating layers are formed by wet-etching using different etching rates of the second and third insulating layers.

9. The method according to claim 1, wherein the second conductive layer includes a polysilicon layer.

10. The method according to claim 1, the first and second conductive layers are formed by anisotropical etching.

11. A method of fabricating a capacitor on a substrate, the method comprising the steps of:
   forming a first insulating layer on the substrate, the first insulating layer having a contact hole;
   forming a first conductive layer in the contact hole and on the first insulating layer;
   forming a second insulating layer on the first conductive layer;
   forming a third insulating layer on the second insulating layer, the third insulating layer having a width wider than the second insulating layer;
   forming a second conductive layer surrounding the second insulating layer, the second conductive layer contacting the first conductive layer and not having a portion below the first conductive layer, and having only a substantially vertically extended portion, whereby the second conductive layer does not have a sharp edged top surface so that a leakage current around the top surface is suppressed;
   removing the third insulating layer;
   removing the second insulating layer;
   removing a portion of the first insulating layer to space apart the first conductive layer from a surface of the first insulating layer;
   forming a dielectric layer on an exposed surface over the substrate; and
   forming a third conductive layer on the dielectric layer.

12. The method according to claim 11, wherein the first insulating layer includes an oxide/nitride/oxide layer.

13. The method according to claim 11, wherein the first insulating layer includes multi-layers having different insulating characteristics.

14. The method claim 11, wherein the first conductive layer includes a polysilicon layer.

15. The method in claim 11, wherein the second insulating layer has an etch rate higher than the third insulating layer.

16. The method according to claim 11, wherein the second insulating layer includes an oxide layer.

17. The method according to claim 11, wherein the third insulating layer includes a nitride layer.

18. The method according to claim 11, wherein the second and third insulating layers are formed by wet-etching using different etch rates of the second and third insulating layers.

19. The method according to claim 11, wherein the second conductive layer includes a polysilicon layer.

20. The method according to claim 11, wherein the steps of forming a second conductive layer includes the steps of forming the second conductive layer on the entire surface of the substrate and antisotropically etching the first and second conductive layers.

21. The method according to claim 11, wherein the step of removing a portion of the first insulating layer includes one of anisotropic etching or wet-etching.

22. The method according to claim 11, wherein the step of removing the second insulating layer includes wet-etching.

* * * * *